United States Patent
Yonekura et al.

(10) Patent No.: US 6,849,128 B2
(45) Date of Patent: Feb. 1, 2005

(54) ORGANIC EL DISPLAY AND PRODUCTION DEVICE OF COLOR FILTER CROSS REFERENCE TO RELATED APPLICATION

(75) Inventors: Seiji Yonekura, Hitachi (JP); Yoshinobu Fukano, Tsuchiura (JP); Mamoru Okano, Hitachi (JP); Yasuo Imanishi, Hitachi (JP); Sukekazu Aratani, Hitachiota (JP); Yoshiharu Nagae, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/452,133

(22) Filed: Jun. 3, 2003

(65) Prior Publication Data

US 2003/0201550 A1 Oct. 30, 2003

Related U.S. Application Data

(63) Continuation of application No. 10/105,336, filed on Mar. 26, 2002.

(30) Foreign Application Priority Data

Mar. 29, 2001 (JP) .................................... 2001-094556

(51) Int. Cl.[7] .............................................. B05B 5/025
(52) U.S. Cl. .................................... 118/621; 118/624
(58) Field of Search ........................... 118/621, 624, 118/628, 629, 638, 620; 347/55, 112, 141; 427/458, 472

(56) References Cited

U.S. PATENT DOCUMENTS

| 4,717,926 A | * | 1/1988 | Hotomi ........................ 347/55 |
| 5,019,748 A |   | 5/1991 | Appelberg |
| 5,988,795 A | * | 11/1999 | Suetsugu et al. ............. 347/55 |
| 6,241,341 B1 | * | 6/2001 | Nakazawa et al. ............ 347/55 |
| 6,368,675 B1 | * | 4/2002 | Louks et al. ................. 427/420 |
| 6,557,981 B1 | * | 5/2003 | Fukano et al. ................ 347/55 |

FOREIGN PATENT DOCUMENTS

WO    WO99/48339    9/1999

\* cited by examiner

*Primary Examiner*—Melvin C. Mayes
*Assistant Examiner*—Yewebdar Tadesse
(74) *Attorney, Agent, or Firm*—Antonelli, Terry, Stout & Kraus, LLP

(57) ABSTRACT

A device for producing a color filter includes a part for storing a solution in which a light transmitting material is dissolved, a part for feeding the solution to a tip of a flying electrode, a part for applying a voltage between the tip of the flying electrode and an electro-conductive material of a color filter substrate so as to form an electrostatic field, and a part for relatively shifting the tip of the flying electrode and the color filter substrate with respect to one another in at least one of a perpendicular direction and to a horizontal direction. The solution is formed into a stringy beam which is let to fly onto the color filter substrate so that the solution is injected into a concavity formed and surrounded by a black matrix on the color filter substrate, arid forms red, green and blue light emitting layers.

6 Claims, 6 Drawing Sheets

ORGANIC EL DISPLAY AND PRODUCTION DEVICE OF COLOR FILTER CROSS REFERENCE TO RELATED APPLICATION

CROSS REFERENCE TO RELATED APPLICATION

This is a continuation of U.S. application Ser. No. 10/105,336, filed Mar. 26, 2002, the subject matter of which is incorporated by reference herein.

FIELD OF THE INVENTION

This invention relates to an organic EL (electro-luminescence) display forming light-emitting layers capable of making a full color display, and to a device for production of a color filter.

BACKGROUND OF THE INVENTION

An organic EL element is an element constituted of a thin film containing a fluorescent organic compound, said film being held between a cathode and an anode. When an electron and a hole are injected into the thin film and recombined, an exciton is formed, and upon de-activation of the exciton, a light (fluorescent light or phosphorescent light) is emitted from the element.

Characteristic feature of the organic EL element consists in that it can emit a surface light having so high luminance as 100 to 100,000 cd/m2 at a low voltage of 10 V or less, and it can emit a light ranging from blue color to red color by selecting the kind of fluorescent material.

In WO 99/48339, there is disclosed a technique of forming a full color display type organic EL display by subjecting an organic EL material which has so far been considered impossible to pattern to an ink jet process (the piezo jet process and the process of discharging the material by the action of thermally caused bubble formation).

However, the above-mentioned WO 99/48339 makes no mention about the means for letting fly an organic EL material against fine pixels and the method for improving the reliability by giving a flying drop shape necessary for forming a uniform organic light emitting layer and preventing the clogging of ink jet nozzle.

SUMMARY OF THE INVENTION

For letting an organic EL material fly by the ink jet process, it is necessary to dissolve the organic EL material in a solvent to form a dilute solution so that the drops can fly.

Further, for vaporizing off the solvent after flying of the solution and thereby forming an organic light-emitting layer, it is also necessary that the solvent used has a high volatility.

However, in the hitherto adopted piezo driving ink jet process or the discharging process by the thermally caused bubble formation, the nozzle has to have a small diameter at the ink jet head in order to make small the flying quantity of organic EL material solution so as to match with the fineness of pixel. As its result, a solvent of high volatility dries up at the tip of nozzle to cause clogging of the nozzle.

Further, it has been difficult in the ink jet process (the piezo jet process and the discharging process by thermally caused bubble formation) to form a uniform organic light-emitting layer because, in the ink jet process, the solution of organic EL material flies in the form of fine dots and a pixel is formed as an assembly of the dots.

This invention aims at solving the problems mentioned above, and the object thereof is to provide a production device of organic EL display capable of making a full color display by patterning red-, green- and blue-colored uniform organic light emitting layers at every pixel in a high reliability by the action of an electrostatic field. A further object of this invention is to provide an organic EL display which is uniform and free from color mixing, by the use of said production device.

The device of this invention has a means for storing a solution in which a light emitting material is dissolved, a means for feeding the solution to a tip of a flying electrode, a means for applying a voltage between the tip of the flying electrode and an electrically conductive material of an organic EL substrate and thereby forming an electrostatic field, and a means for relatively shifting the tip of the flying electrode and the organic EL substrate to a perpendicular direction and to a horizontal direction, and is so constructed that the solution is formed into the form of a stringy beam from the tip of the flying electrode to let it fly onto the organic EL substrate, thereby injecting the solution into a concavity formed and surrounded by banks on the organic EL substrate, and forming red, green and blue light emitting layers.

Other objects, features and advantages of the invention will become apparent from the following description of the embodiments of the invention taken in conjunction with the accompanying drawings.

EXPLANATION OF THE SYMBOLS

1—organic EL display, 2—solution flying device, 3—flying electrode, 3-1—tip of flying electrode, 4—electrode holder, 5—voltage applying circuit, 6—solution, 6-1—solution beam, 7—container, 8—solution transporting path, 9—electro-conductive material, 11—bank, 12—insulating layer (SiO2), 13—electro-conductive layer, 14—transparent electrode, 15—glass substrate, 20—cathode, 31—flying electrode, 31-1—tip of flying electrode, 32—control electrode, 32-1 tip of control electrode, 33—glass substrate, 33-1—tip of glass substrate, 34—resin film, 35—insulating protective film, 36—resin film, 37—resin film, 38—resin film, 39—solution feeding hole, 40—cover, 41—solution recovering member, 42—minute gap, 50—voltage applying circuit, 61—organic EL display, 62—display part, 63—data driving circuit, 64—scanning circuit, 65—electric current supply circuit, 66—substrate, 67—data line, 68—gate line, 69—common electrode, 70—electric current supply line, 100—color filter, 110—black matrix, 130—ITO transparent electrode, 150—glass substrate.

DETAILED DESCRIPTION OF THE INVENTION

Figure 1:
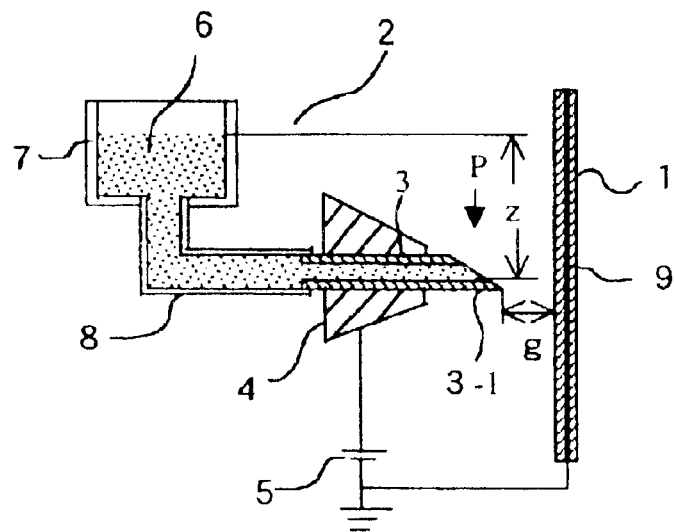
FIG. 1 is a cross-sectional view illustrating the production device of the organic EL display of this invention.

FIG. 1 illustrates one embodiment of the production device of the organic EL display of this invention.

In FIG. 1, 1 is an organic EL display, 2 is a solution flying device, 3 is a flying electrode, 4 is an electrode holder, 5 is a voltage applying circuit, 6 is a solution in which a light-emitting material is dissolved, 7 is a container, and 8 is a solution transporting path.

The flying electrode 3 is made of an electro-conductive metal. For example, it is a stainless pipe having an inner diameter of 150–250 μm. The flying electrode tip 3-1 has a sharp pointed shape, and is held so as to keep a narrow gap g from the organic EL display 1.

To the flying electrode tip 3-1 is fed the solution 6 from container 7 made of glass or the like through a solution transporting path 8 made of Teflon tube or the like.

A direct current high voltage of about 1.5–3 kV is applied to the voltage applying circuit 5 in the above-mentioned state, whereby a high electrostatic field can be formed between the flying electrode tip 3-1 and the electro-conductive material 9 via the electrode holder 4 made of an electro-conductive metal.

Herein, the solution 6 is a solution of a light-emitting material such as PPV (polyparaphenylenevinylene) derivative in a high electric resistance solvent such as xylene or the like, and its electric resistance is preferably 107 Ω·cm or more, and its surface tension is preferably 30 mN/m or less.

Due to formation of the above-mentioned high electrostatic field, the solution 6 flies from the flying electrode tip 3-1 toward the organic EL display 1.

As a method for feeding the solution 6 to the tip 3-1 of the flying electrode, the present example uses an elevation head z between the liquid surface of the solution in container 7 and the flying electrode tip 3-1. The flying of solution can be retained so far as the feeding of solution 6 to the flying electrode tip 3-1 and an application of a high voltage to the voltage applying circuit 5 are continued.

In the example of FIG. 1, the organic EL display 1 is placed perpendicularly, the flying electrode 3 is placed horizontally, and the flying direction of the solution 6 is fixed downward. It is also possible, however, to place the organic EL display 1 upward, the flying electrode 3 downward, and the flying direction of solution 6 downward. Further, it is also possible to make fly the solution 6 in an oblique direction from the viewpoint of overall layout of the device.

Figure 2:
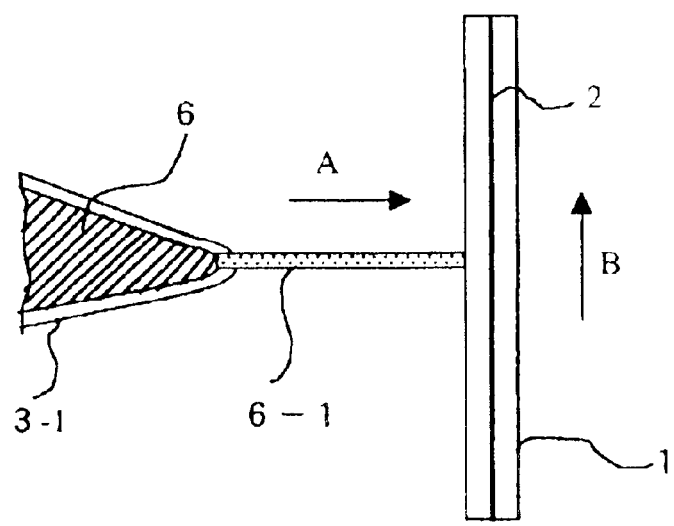
FIG. 2 is an enlarged view of FIG. 1 in the direction of P.

FIG. 2 is an expanded view from P direction of the neighborhood of flying electrode 3 of FIG. 1. The solution 6 supplied to tip 3-1 of the flying electrode forms a stringy solution beam 6-1 stretched in the direction of arrow A from the flying electrode tip 3-1 to the organic EL display 1 due to the electrostatic field between flying electrode tip 3-1 and electro-conductive material 9, and continuously flies.

Accordingly, by shifting the organic EL display 1 and the flying electrode tip 3-1 relatively to each other in the direction of arrow B, a straight line of solution 6 can continuously be pictured on the surface of organic EL display 1, and thereby the solution 6 can be injected into surface of the organic EL display 1. By varying the velocity of the shifting, the amount of solution 6 injected can be controlled.

Among the means for forming the electrostatic field of FIG. 1, control of the direct current voltage applied to the voltage applying circuit 5 or control of the gap g is useful for varying thickness of the stringy solution beam 6-1.

It is also possible to control the amount of injected solution 6-1 into the organic EL display 1 by in-series applying a pulse voltage (not shown in the drawing) to the voltage applying circuit 5 of FIG. 1 in addition to the above-mentioned direct current voltage, and so as to cut the stringy solution beam 6-1 of FIG. 2 intermittently.

It is also possible to cut the stringy solution beam 6-1 of FIG. 2 intermittently by lowering the direct current voltage applied to the voltage applying circuit 5 of FIG. 1.

Figure 3:
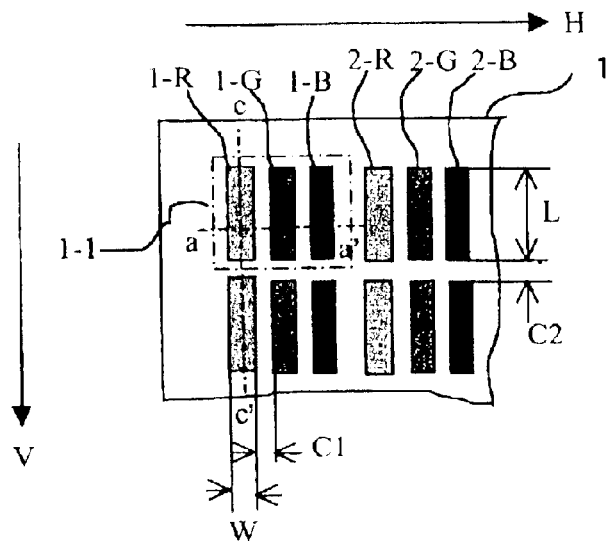
FIG. 3 is a diagram illustrating the disposition of the color display part of the organic EL display in FIG. 1.

FIG. 3 illustrates one example of the color display disposition of the organic EL display 1, wherein 1-R is red-colored pixel, 1-G is green-colored pixel, and 1-B is blue-colored pixel. A full color display pixel 1—1 is constructed by summarizing the pixels of red, green and blue colors.

The size of full color display pixel 1—1 varies depending on the display density. For example, the size is 127 λm×127 λm in the case of 200 PPI (pixel/inch), and 254 μm×254 λm in the case of 100 PPI. It follows that width W of each display element (red, green and blue) is about 30 μm in the case of 200 PPI and about 60 μm in the case of 100 PPI, and the length L is about 120 μm in the case of 200 PPI and about 240 μm in the case of 100 PPI. The gaps C1 and C2 between the red, green and blue pixels are about 10 μm in the case of 200 PPI and about 20 μm in the case of 100 PPI.

Solution 6 can be filled into red colored pixels by shifting the flying electrode 3 of FIG. 1 in the direction of arrow V relatively to the organic EL display 1 shown in FIG. 3.

Solution 6 can easily be filled into fine pixels while varying thickness of the stringy solution beam 6-1 of FIG. 2 in accordance with the width W.

Further, since the display pixels into which the solution 6 is to be filled are as fine as have been mentioned above, the influence of capillary phenomenon can overpass gravity of solution 6, so that solution 6 can be filled into any of horizontally disposed organic EL display 1 and upward disposed organic EL display 1.

At this time, a surplus adhesion of the solution to the gap C2 part can be prevented by stopping the application of high voltage from the voltage application circuit 5 of FIG. 1 or by lowering the input voltage to stop the flying of solution 6 only in the areas corresponding to gap C2. Needless to say, it is also possible to continue the flying of solution 6 without stopping the flying. After the filling into the flying row 1-R has been completed, the flying electrode 3 of FIG. 1 is shifted to the next row of pixel 2-R for red-colored display, in the direction of arrow H relatively to the organic EL display 1 shown in FIG. 3.

Subsequently, the flying electrode 3 of FIG. 1 is shifted in the direction opposite to the direction of arrow V, relatively to the organic EL display 1 shown in FIG. 3, and the solution 6 is filled into the red-colored display pixel row 2-R.

By repeating the above-mentioned procedures, solution 6 is filled into all the red-colored display pixels on the organic EL display 1. In the same manner as above, solution 6 can be filled into green-colored pixels 1-G, 2-G and blue-colored pixels 1-B, 2-B, too.

Needless to say, it is also possible to achieve a similar filling of solution 6 by shifting the organic EL display 1 while fixing the flying electrode 3.

From the viewpoint of improving the productivity, it is desirable to dispose individual solution flying devices 2 for red, green and blue colors of FIG. 1 in parallel to one another and carry out the flying simultaneously.

Further, it is desirable form the viewpoint of further improving the productivity to dispose a plurality of flying electrodes 3 in parallel in the solution flying device 2 of FIG. 1, and to carry out the flying simultaneously. Especially, productivity can further be improved by making the flying electrodes 3 into a line in accordance with the size of organic EL display 1.

Figure 4:
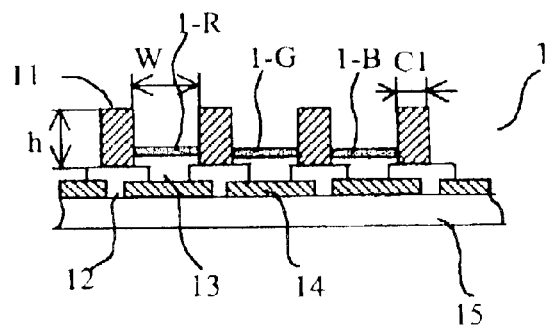
FIG. 4 is a view illustrating the a–a' cross section of the organic EL display of FIG. 3 and the b–b' cross section of the organic EL display of FIG. 6.

FIG. 4 illustrates the a-a' cross-sectional structure of the organic EL display 1 of FIG. 3, wherein 11 is a bank, 12 is an insulating layer made of SiO2 or the like, 13 is an electro-conductive layer which is a positive pore-injecting layer, 14 is a transparent electrode, 15 is a glass substrate, 1-R is a red-colored light emitting layer, 1-G is a green-colored light emitting layer, and 1-B is a blue-colored light emitting layer. The insulating layer 12 may be omitted. As the transparent electrode 14, ITO (indium tin oxide), IZO (indium zinc oxide), and the like are used. In a case of using a structure of withdrawing the light from the upper part, it is also possible to use an opaque electrode made of a metal such as Cr, Al or the like.

The same earthing effect as that brought about by the earthing of electro-conductive material 9 of FIG. 1 can be obtained by earthing each of the transparent electrodes 14 for each of the display pixels while maintaining the transistors (not shown in the figure) for driving each of the display pixels. Needless to say, it is also possible to dispose an electro-conductive material 9 for earthing in the organic EL display or under the glass substrate 15, besides the transparent electrode 14.

Bank 11 is constituted of a low dielectric constant material such as polyimide resin or the like, and its thickness C1 is as depicted by the C1 of the above-mentioned FIG. 3. Its height h is 2–10 μm, and its W is as shown by the W in the above-mentioned FIG. 3. Solution 6 is filled into the concavity surrounded by bank 11 by the use of the above-mentioned solution flying device 2, after which the high-volatility solvent such as xylene or the like is vaporized off to form red-colored light emitting layer 1R, green-colored light emitting layer 1G and blue-colored light emitting layer 1B all having a thickness of 50–100 nm. Needless to say, the solution 6 can be filled in the same manner as above and the same effect as above can be exhibited not only in the above-mentioned case of forming a three-colors light emitting layer but also in the cases of forming two-colors or one-color light emitting layer.

Herein, it is important to make small the surface roughness of each light emitting layer in order to improve the light-emitting characteristics. Surface roughness of each light-emitting layer can be made small by continuously injecting the solution by the use of the above-mentioned solution flying device 2.

After injecting the solution 6 into the concavity surrounded by bank 11 by the use of solution flying device 2 and vaporizing off the high-volatility solvent, the injection of solution 6 is repeated additionally, whereby surface roughness of each light-emitting layer can be made smaller. Since the method of the repeated injection makes it possible to reduce the amount of solution 6 injected at once, such a method is effective for lowering the height h of bank 11 shown in FIG. 4 and lessening the thickness of organic EL substrate.

Figure 5:
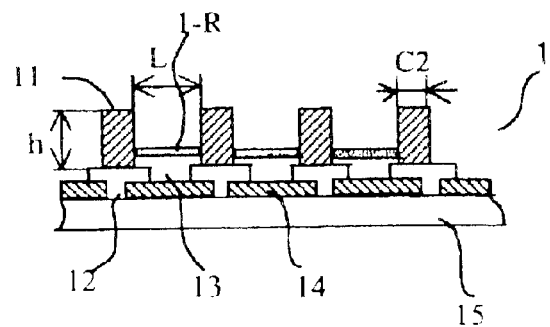
FIG. 5 is a view illustrating the c–c' cross section of the organic EL display of FIG. 3.

FIG. 5 illustrates the c-c' cross-sectional structure of the organic EL display 1 of FIG. 3. In the organic EL display 1 of this example, bank 11 exists between the pixels even in the direction c-c'. Accordingly, if solution 6 is let fly continuously, the solution collide against the bank 11 present between pixels and is scattered to cause a color mixing and an unevenness in the thickness of light emitting layer between pixels and a thereby caused uneven display.

Figure 6:
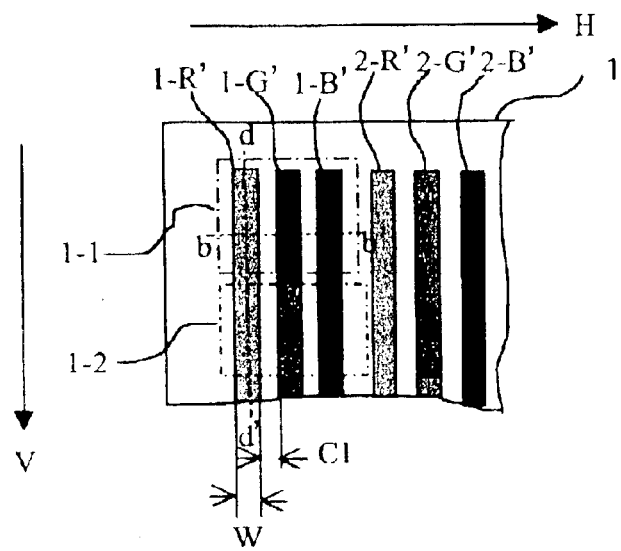
FIG. 6 is a view illustrating the disposition of the color display part of the organic EL display according to another example.
Figure 7:
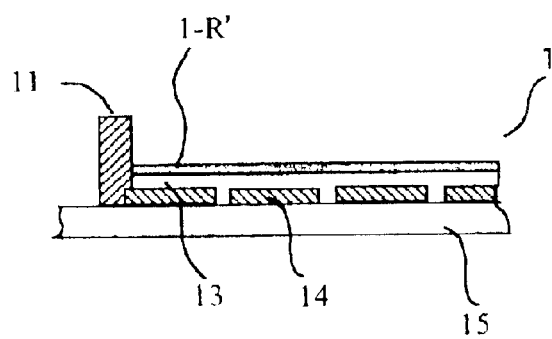
FIG. 7 is a view illustrating the d–d' cross section of the organic EL display of FIG. 6.

FIG. 6 illustrates another example of the organic EL display. In this example, the red-colored light emitting layer 1-R', green-colored light emitting layer 1-G' and blue-colored light emitting layer 1-B' in the range of full color pixel 1—1 are continuously extended to the full color display pixel 12 without partitioning with bank 11 and further prolonged until they reach the maximum length or the whole dimension of organic EL display 1. By shifting the flying electrode tip 3-1 of FIG. 1 in the direction of arrow V, injection of solution 6 becomes possible and the above-mentioned effect of continuous flying of solution 6 can be enhanced. By shifting the flying electrode tip 3-1 in the direction of arrow H, solution 6 can be injected into the ranges of red-colored light emitting layer 2-R', green-colored light emitting layer 2-G' and blue-colored light emitting layer 2-B'. Herein, the transparent electrode 14 shown in FIG. 4 and the driving transistors (not shown in the figure) are disposed for individual colors of display pixel units. That is to say, the cross section b-b' of FIG. 6 is the same as that in FIG. 4. The dimension W and C1 in FIG. 6 are the same as the dimension W and C1 in FIG. 3. FIG. 7 illustrates the d-d' cross-sectional structure of FIG. 6. In the organic EL display of this example, no bank exists between pixels in the direction of d-d', and the solution 6, if made to fly continuously, does not collide with the bank and is not scattered. Thus, no color mixing nor uneven display caused by unevenness in thickness of light emitting layers between pixels occurs in this case, unlike in the preceding example.

Figure 8:
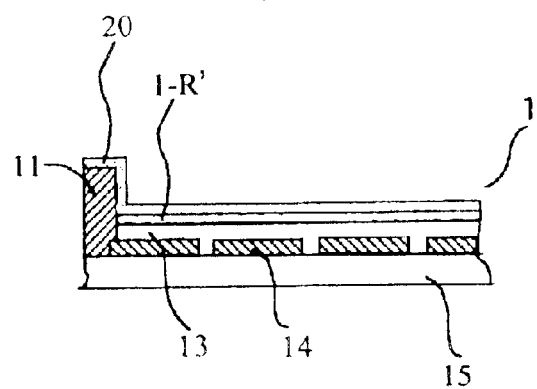
FIG. 8 is a view illustrating the d–d' cross section of the organic EL display of FIG. 6 after the cathode formation.

After forming light emitting layers, a cathode 20 is formed and its upper part is sealed by the use of a sealing can to obtain an organic EL display, as seen in the cross-sectional view of FIG. 8. In cases where light is to be withdrawn from the upper part, an opaque electrode is formed in place of the transparent electrode 14 of this example, and a charge injecting layer and a transparent payer are formed after formation of the light emitting layer and a transparent sealing can is used, whereby an organic EL display making it possible to take out light from its upper part can be obtained.

Figure 9:
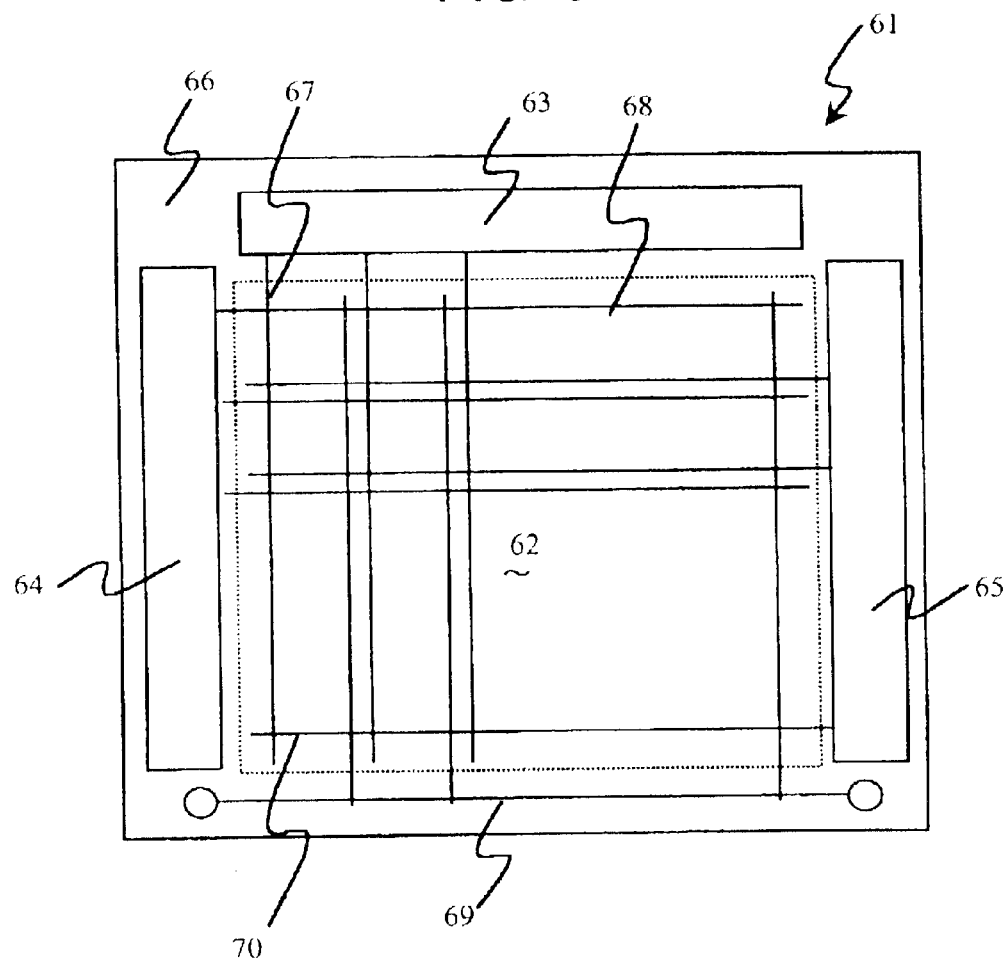
FIG. 9 is a schematic view illustrating an image displaying device using the organic EL display of FIG. 8.

FIG. 9 is a schematic view of an image display device using the organic EL display of this example. In the image display device 61, the nearly central part of substrate 66 functions as a display part 62. A data driving circuit 63 outputting image signals to the data line 67 is provided over the display part 62, a scanning circuit 64 outputting the scanning signals to the gate line 68 is provided in the left side, and a current feeding driving circuit 65 is provided in the right side. These driving circuits 63, 64, 65 are constituted of a shift resistor circuit constituted of a complementary circuit made from N-channel type and P-channel type of TFT, a level shifter circuit, an analogue switch circuit, etc.

The use of the above-mentioned solution flying device 2 is not restricted to the production of organic EL display, but it can be applied to other devices, too. One example of said other device is shown in FIG. 10, which is a structural cross-sectional view of a color filter produced by the use of the solution flying device 2 shown in FIG. 1, in which the organic EL device 1 is replaced by a color filter.

Figure 10:
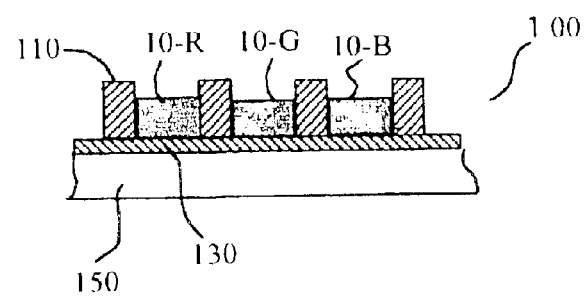
FIG. 10 is a cross-sectional structural view of a color filter.

In FIG. 10, 100 is a color filter, 150 is a glass substrate, 130 is a transparent electrode, and 110 is a black matrix made of a resin. A red-colored filter pixel 10-R, a green-colored filter pixel 10-G and a blue-colored filter pixel 10-B are constructed in the concavity partitioned by black matrix 110. In the solution flying device 2 of FIG. 1, solution 6 is a solution prepared by dissolving light-transmitting pigments or light-transmitting dyes of red, green and blue color in a solvent having a high electric resistance such as isoparaffin, and its electric resistance and surface tension are preferably equal to those used in the organic EL display. A high voltage is applied between the tip 3-1 of flying electrode of FIG. 1 and the ITO transparent electrode 130 of FIG. 6 to make fly a stringy solution beam 6-1 and inject the beam into the above-mentioned concavity, whereby a red-colored filter pixel 10-R, a green-colored filter pixel 10-G and a blue-colored filter pixel 10-B are formed.

By such a procedure, there is provided a production device of color filter which can form a color filter constituted of a red-colored filter pixel 10-R, a green-colored filter pixel 10-G and a blue-colored filter pixel 10-B in the same dimensions as in FIG. 3 and FIG. 6 in high uniformity. Since this device uses no fine nozzles, the color filter thus obtained has a high reliability due to freeness from clogging of fine nozzle.

Figure 11:
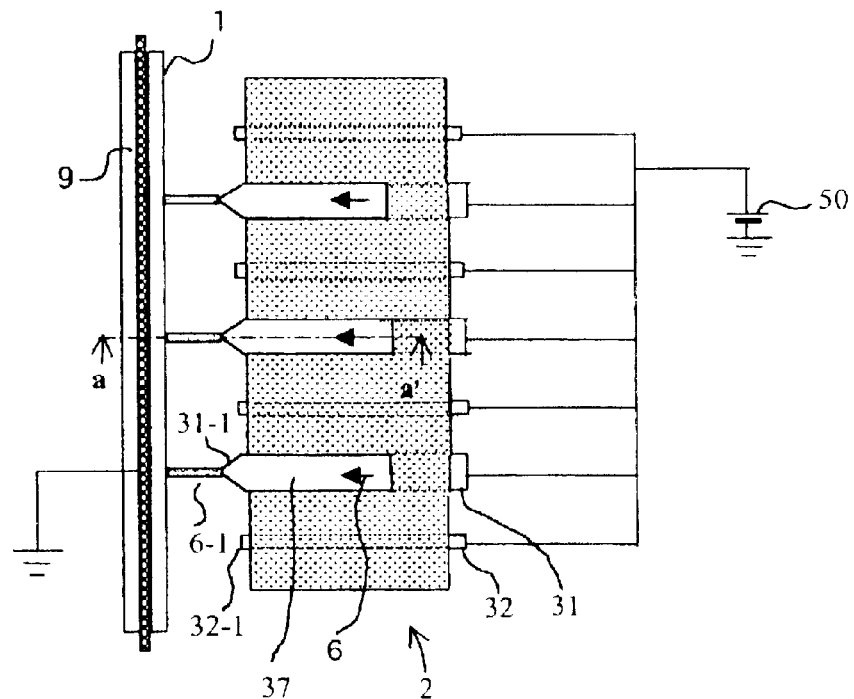
FIG. 11 is a cross-sectional view illustrating the production device of an organic EL display according to another example.
Figure 12:
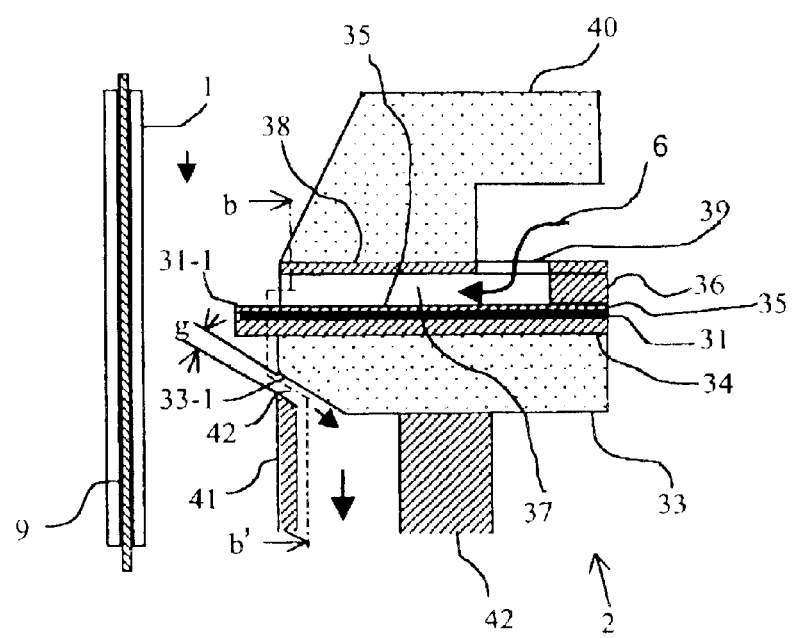
FIG. 12 is a cross-sectional structural views of FIG. 11.
Figure 13:
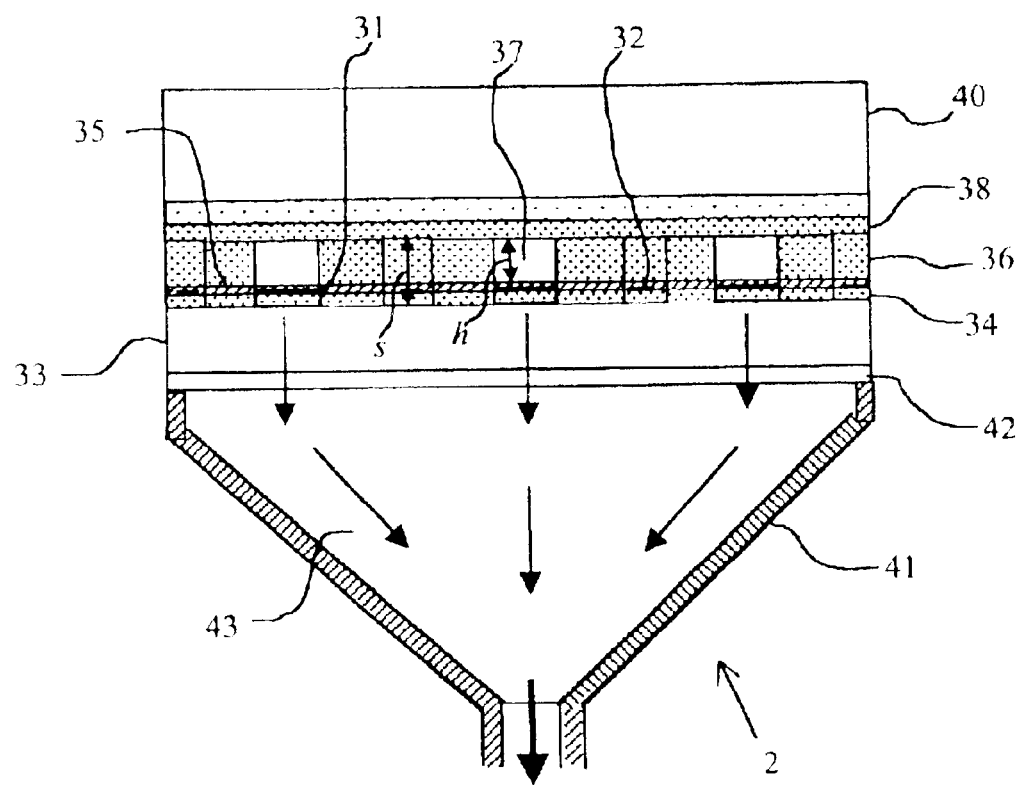
FIG. 13 is a cross-sectional structural view of FIG. 12.

FIG. 11, FIG. 12 and FIG. 13 illustrate the solution flying device 2 of FIG. 1. These are outlined structural diagrams according to another example. FIG. 11 is a top plan cross-sectional view of the solution flying device. FIG. 12 is an a–a' cross-sectional view of FIG. 11. FIG. 13 is a b–b' cross-sectional view of FIG. 12. The flying electrode 31 and control electrode 32 are formed by hot contact-bonding a resin film (for example, a negative photosensitive resin film) 34 of a low dielectric constant material (specific permittivity 3 or less) on a glass substrate 33, vapor depositing a metallic film thereon, and carrying out a photo-lithographic wet etching. The tip 31-1 of the flying electrode is protruded from the terminal surface of glass substrate 33. The tip of flying electrode 31-1 has a sharp pointed angle and such tips are disposed in parallel to one another at constant intervals as shown in FIG. 11. Further, the flying electrode 31 and control electrode 32 are coated with an insulating protective film 35. On the other hand, the tip 32-1 of control electrode is placed at a position which is retrograde from the tip 31-1 of flying electrode and protruded from the terminal surface of glass substrate 33. The control electrodes 32 are disposed at constant intervals between the flying electrodes 31.

Since the tip 32-1 of control electrode is covered with a low dielectric constant resin film 34 through intermediation of insulating protective film 35 and is protruded, it plays a role of mechanically intercepting the solution meniscus between the adjacent flying electrodes 31 and a role of intercepting an interference of the electric field between the adjacent flying electrodes 31 and, at the same time, it makes it possible to fly the solution evenly with a lessened influence of the adjacent flying electrodes 31 such as bending of flying solution beam and unevenness of thickness. In order to make more efficient the action of mechanically intercepting the solution meniscus between adjacent flying electrodes 31, it is desirable to make the height s of the tip of control electrode equal to or greater than the height h of the solution path.

The tip of control electrode is made of a dielectric resin and so constructed as to cover the tip of a metallic control electrode and protrude from the terminal surface of glass electrode 33. Needless to say, the same effect as above can be achieved by forming a similar shape only from a metallic control electrode.

As shown at FIGS. 12 and 13, by subjecting a resin film 36 of low dielectric constant material (for example, negative type photosensitive resin film) which has been hot contact bonded onto insulating protective film 35 to a lithographic wet etching, the solution feeding path 37 in the solution flying device 2 is formed over and along the flying electrode 31.

Subsequently, a resin film of low dielectric constant material (for example, a negative type photosensitive resin film) 38 is put on the solution feeding path 37, and hot contact bonded onto the above-mentioned dielectric resin film 36 to close the solution feeding path 37 tightly, after which the solution feeding hole 39 is formed by wet etching. Then, cover 40 is bonded onto the low dielectric constant resin film 38. Thus, it becomes possible to supply the solution 6 to the solution feeding path 37.

As shown in FIG. 11, the solution feeding path 37 is formed along the flying electrode 31, to which is supplied the solution 6 in the direction of arrow, and the solution supplied flows toward the tip 31-1 of the flying electrode.

In FIGS. 11 and 13, three flying electrodes 31 and four control electrodes 32 are pictured for convenience. It is needless to say, however, that numbers of flying electrodes 31 and control electrodes 32 can be varied in the range of from several tens to several thousands in accordance with the use of solution flying device 2 by alternately disposing a flying electrode 31 and a control electrode 32, and a multi-channel type solution flying device and a line type solution flying device can be constructed based on the same idea as above.

In this state, a voltage is input on each of the flying electrodes 31 by means of the voltage applying circuit 50. The content of the solution is the same as has been mentioned above. Thus, by applying a voltage from the voltage applying circuit 50 of FIG. 11, an electric field is formed between the earthed electro-conductive material 9 and the organic EL display 1, and solution 6 becomes able to fly in the form of solution beam 6-1.

It is also possible to provide another voltage applying circuit (not shown in the figure) for applying a voltage lower than an applied voltage of voltage applying circuit 50 to each of the flying electrodes 31 in series with the voltage applying circuit 50 in a state that a voltage from the voltage applying circuit 50 is applied to each of the control electrodes 32, in order to control the flying of solution beam 6-1 from each flying electrode 32 by on/off change of said another applying circuit.

Next, the structure for recovering the residual solution after the flying of solution will be explained by referring to FIG. 12 and FIG. 13. A minute gap 42 having a constant dimension g is provided between the tip 33-1 of a glass substrate having a sloped surface in the side closer to the flying electrode and the solution recovering member 41. The above-mentioned residual solution can be recovered into the solution recovering path 43 formed of the solution recovering member 41 and the sloped glass substrate 33, downward the tip 31-1 of flying electrode, at an angle crossing with the direction of the flying electrode tip 31-1, along the terminal surface 33-1 of glass electrode.

It should be further understood by those skilled in the art that the foregoing description has been made on embodiments of the invention and that various changes and modifications may be made in the invention without departing from the spirit of the invention and the scope of the appended claims.

Effects of the Invention

According to the production device of organic EL display capable of making a full color display of this invention, there can be provided a production device capable of forming a uniform light emitting layer and free from clogging of nozzles, and there can be provided an organic EL display which is uniform and free from color mixing.

What is claimed is:

1. A device for producing a color filter comprising:
   means for storing a solution in which a light transmitting material is dissolved for formation of red, green and blue light emitting layers in the color filter;
   means for feeding the solution to a tip of a flying electrode; and
   means for applying a voltage between the tip of the flying electrode and an electro-conductive material of a color filter substrate so as to form an electrostatic field,
   wherein the tip of the flying electrode and the color filter substrate are relatively shifted with respect to one another in at least one of a perpendicular direction and to a horizontal direction, and
   wherein the solution is formed into a stringy beam which is let to fly onto the color filter substrate so that the solution is injected into a concavity formed and surrounded by a black matrix on the color filter substrate, and forms red, green and blue light emitting layers.

2. The device for producing a color filter according to claim 1,
   wherein the amount of injection of the solution is varied by controlling a velocity of relative shifting of the tip of the flying electrode and the color filter substrate to a perpendicular dictions.

3. The device for producing a color filter according to claim 1,
   wherein the amount of injection of the solution is varied by controlling a velocity of relative shifting of the tip of the flying electrode and the color filter substrate in the perpendicular direction.

4. The device for producing a color filter according to claim 1,
   wherein the means for forming an electrostatic filed includes applying a voltage obtained by in-series overlapping of a pulse voltage on a direct current voltage of bias, and the stringy beam is intermittently cut by controlling the electrostatic field.

5. The device for producing a color filter according to claim 1,
   wherein the solution is injected into the concavity formed and surrounded by the black matrix and, after vaporizing off of a solvent, the injection of the solution is repeated.

6. The device for producing a color filter according to claim 1,
   wherein the device has a plurality of flying electrodes.

* * * * *